United States Patent
Bauer et al.

(10) Patent No.: US 12,274,073 B2
(45) Date of Patent: Apr. 8, 2025

(54) MULTIFERROIC MEMORY WITH PIEZOELECTRIC LAYERS AND RELATED METHODS

(71) Applicant: EAGLE TECHNOLOGY, LLC, Melbourne, FL (US)

(72) Inventors: Matt Bauer, Melbourne, FL (US); Steven R. Snyder, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 415 days.

(21) Appl. No.: 17/583,596

(22) Filed: Jan. 25, 2022

(65) Prior Publication Data

US 2023/0240080 A1  Jul. 27, 2023

(51) Int. Cl.
*H10B 61/00* (2023.01)
*G11C 11/14* (2006.01)
(Continued)

(52) U.S. Cl.
CPC .............. *H10B 61/00* (2023.02); *G11C 11/14* (2013.01); *G11C 11/161* (2013.01);
(Continued)

(58) Field of Classification Search
CPC ....... H10B 61/00; G11C 11/14; G11C 11/161; G11C 11/1673; G11C 11/1675;
(Continued)

(56) References Cited

U.S. PATENT DOCUMENTS

| 7,633,795 B2 | 12/2009 | Shimomura et al. |
| 10,593,389 B2 | 3/2020 | Atulasimha et al. |

(Continued)

FOREIGN PATENT DOCUMENTS

| CN | 102272847 | 12/2011 |
| CN | 203521478 | 4/2014 |

(Continued)

OTHER PUBLICATIONS

Spaldin, N.A. "Multiferroics: Past, present, and future." MRS Bulletin 42, 385-390 (2017) (Year: 2017).*

(Continued)

*Primary Examiner* — Joseph C. Nicely
*Assistant Examiner* — Alvin L Lee
(74) *Attorney, Agent, or Firm* — ALLEN, DYER, DOPPELT, GILCHRIST, P.A. Attorneys at Law

(57) ABSTRACT

An electronic device may include a first electrode, a first piezoelectric layer electrically coupled to the first electrode, a first magnetostrictive layer above the first piezoelectric layer, a first tunnel barrier layer above the first magnetostrictive layer, and a ferromagnetic layer above the first ferroelectric layer. The electronic device may further include a second electrode electrically coupled to the ferromagnetic layer a second tunnel barrier layer above the ferromagnetic layer, a second magnetostrictive layer above the second tunnel barrier layer, a second piezoelectric layer above the second magnetostrictive layer, and a third electrode electrically coupled to the second piezoelectric layer. The first piezoelectric layer may be strained responsive to voltage applied across the first and second electrodes, and the second piezoelectric layer may be strained responsive to voltage applied across the second and third electrodes.

23 Claims, 7 Drawing Sheets

(51) Int. Cl.
*G11C 11/15* (2006.01)
*G11C 11/16* (2006.01)
*G11C 11/56* (2006.01)
*H10N 30/00* (2023.01)
*H10N 30/05* (2023.01)
*H10N 30/85* (2023.01)
*H10N 30/87* (2023.01)
*H10N 50/01* (2023.01)
*H10N 50/80* (2023.01)
*H10N 50/85* (2023.01)

(52) U.S. Cl.
CPC ...... *G11C 11/1673* (2013.01); *G11C 11/1675* (2013.01); *G11C 11/5607* (2013.01); *G11C 11/5657* (2013.01); *H10N 30/05* (2023.02); *H10N 30/704* (2024.05); *H10N 30/85* (2023.02); *H10N 30/87* (2023.02); *H10N 50/01* (2023.02); *H10N 50/80* (2023.02); *H10N 50/85* (2023.02); *G11C 11/15* (2013.01); *G11C 11/165* (2013.01)

(58) Field of Classification Search
CPC . G11C 11/5607; G11C 11/5657; G11C 11/15; G11C 11/165; G11C 11/1659; G11C 11/221; H10N 30/05; H10N 30/1051; H10N 30/85; H10N 30/87; H10N 50/01; H10N 50/80; H10N 50/85; H10N 50/10
See application file for complete search history.

(56) References Cited

U.S. PATENT DOCUMENTS

| | | | |
|---|---|---|---|
| 11,043,251 B2 | 6/2021 | Shen et al. | |
| 2009/0067224 A1* | 3/2009 | Hochstrat | G11C 11/2275 365/158 |
| 2010/0102369 A1* | 4/2010 | Tian | G11C 11/1675 257/295 |
| 2014/0043895 A1* | 2/2014 | Bibes | G11C 11/1675 365/171 |
| 2016/0141333 A1 | 5/2016 | Bandyopadhyay et al. | |
| 2017/0178780 A1* | 6/2017 | Taniyama | H01L 29/66984 |
| 2017/0236993 A1* | 8/2017 | Gopman | G01R 33/098 310/311 |
| 2020/0294581 A1 | 9/2020 | Bibes et al. | |
| 2020/0335690 A1 | 10/2020 | Eom et al. | |
| 2021/0390994 A1* | 12/2021 | Xu | H10N 50/85 |

FOREIGN PATENT DOCUMENTS

| | | | | |
|---|---|---|---|---|
| CN | 103915109 | | 7/2014 | |
| CN | 104603882 | | 5/2015 | |
| CN | 105531767 | | 4/2016 | |
| CN | 105762275 | | 7/2016 | |
| CN | 106328807 | A * | 1/2017 | G11C 13/00 |
| CN | 107068173 | | 8/2017 | |
| CN | 109243511 | | 1/2019 | |
| CN | 110164494 | | 8/2019 | |
| DE | 112013007054 | | 3/2016 | |
| JP | 2013236014 | A * | 11/2013 | |
| KR | 20160003763 | | 1/2016 | |
| WO | WO2012149414 | | 11/2012 | |
| WO | WO2013090937 | | 6/2013 | |
| WO | WO2016198886 | | 12/2016 | |
| WO | WO2019213663 | | 11/2019 | |

OTHER PUBLICATIONS

U.S. Appl. No. 17/583,539, filed Jan. 25, 2022 Bauer et al.
U.S. Appl. No. 17/583,564, filed Jan. 25, 2022 Bauer et al.
Amiri et al. "Electric-Field-Controlled Magnetoelectric RAM: Progress, Challenges, and Scaling" IEEE Transactions on Magnetics, vol. 51, No. 11, Nov. 2015; pp. 7.
Fong et al. "Spin-Transfer Torque Memories: Devices, Circuits, and Systems" Proceedings of the IEEE; . vol. 104, No. 7, Jul. 2016; pp. 40.
Shaodi Wang "Design, Evaluation and Co-optimization of Emerging Devices and Circuits" Proquest 2017; ProQuest No. 10284410; pp. 24.
Yuewei Yin "A review on all-perovskite multiferroic tunnel junctions" Journal of Materiomics vol. 3, Issue 4, Dec. 2017, pp. 245-254; pp. 33.

* cited by examiner

MULTIFERROIC MEMORY WITH PIEZOELECTRIC LAYERS AND RELATED METHODS

TECHNICAL FIELD

This application relates to the field of electronic devices, and more particularly, to memory devices and related methods.

BACKGROUND

Magnetoresistive random access memory (MRAM) devices utilize a difference in resistance of a spin polarized current, created by a fixed ferromagnetic layer, flowing through a free ferromagnetic layer to store information. The read operation is performed by sensing the resistance in the memory cell. Current is limited by whether the spin polarization induced by the free layer matches the spin of electrons in the tunnel junction and fixed layer. Specifically, if there is a mismatch, then current flow is reduced. This empirical observation is explained by spin dependent scattering, where the split electron band in ferromagnets leads to a higher density of states in minority spin than majority spin electrons. The higher density of states leads to a stronger scattering, lower mean free path, and thus higher resistance for the minority spin electrons. Lauded for its high durability, fast switching speeds, and low standby-power consumption and cost, MRAM technology may replace the more-traditional transistor-based memory devices, e.g., Static Random-Access Memory, and complement Dynamic Random-Access Memory.

U.S. Pat. No. 7,633,795 to Shimomura et al. discloses a write control method for an MRAM, which includes a memory cell having a recording layer with an axis of easy magnetization and an axis of hard magnetization. The write control method includes writing a datum into the memory cell. The writing of the datum includes applying a pulsative first magnetic field substantially parallel to the axis of easy magnetization of the recording layer and a pulsative second magnetic field substantially parallel to the axis of hard magnetization to the recording layer so as to cause a period of the pulsative first magnetic field and a period of the pulsative second magnetic field to overlap each other, and applying a pulsative third magnetic field having substantially the same direction as the pulsative first magnetic field to the recording layer at least once after applying the pulsative first magnetic field to the recording layer.

Typical methods of writing data to MRAMs may cause a limitation in performance. In Toggle MRAM, the magnetization of the free layer is switched with an external field caused by current flow through a nearby inductor. In other cases, it may be switched with spin polarization, as in Spin Transfer Torque (STT-MRAM). For an STT-MRAM write operation, current is fed through the fixed layer and the electrons become spin-polarized (i.e., they spin, and their magnetization vectors all point in the same direction). The polarized electrons are then flowed through the free layer, magnetizing it according to the electron spin polarization. While the power required for the read operation and standby is still very low in these devices, the current-driven write step results in memory densities that are constrained by the limits of heat dissipation.

As such, further advancements in magnetoresistive memory devices may be desirable in certain applications. Namely, advances that reduce write current and resultant heat generation.

SUMMARY

An electronic device may include a first electrode, a first piezoelectric layer electrically coupled to the first electrode, a first magnetostrictive layer above the first piezoelectric layer, a first tunnel barrier layer above the first magnetostrictive layer, and a ferromagnetic layer above the first tunnel barrier layer. The electronic device may further include a second electrode electrically coupled to the ferromagnetic layer a second tunnel barrier layer above the ferromagnetic layer, a second magnetostrictive layer above the second tunnel barrier layer, a second piezoelectric layer above the second magnetostrictive layer, and a third electrode electrically coupled to the second piezoelectric layer. The first piezoelectric layer may be strained responsive to voltage applied across the first and second electrodes, and the second piezoelectric layer may be strained responsive to voltage applied across the second and third electrodes.

In an example embodiment, the electronic device may further include a first read/write electrode coupled to the first magnetostrictive layer, and a second read/write electrode coupled to the second magnetostrictive layer. By way of example, the first and second magnetostrictive layers may comprise at least one of Co, Fe, NiFe, MnAs, $Fe_4N$, MnAl, $Co_4N$, LSMO, and $SrRuO_2$. Also by way of example, the ferromagnetic layer may comprise at least one of Co, Fe, NiFe, MnAs, $Fe_4N$, MnAl, $Co_4N$, LSMO, and $SrRuO_2$. The first and second piezoelectric layers may comprise at least one of $BaTiO_3$, $Ba_{0.95}Sr_{0.05}TiO_3$, $Hf_{0.5}Zr_{0.5}O_2$, $PbTiO_3$, $YMnO_3$, $BiFeO_3$, Si doped $HfO_2$, $SrBi_2TaO_9$, and $PbZr_xTi_{1-x}O_3$, for example.

In one example implementation, the first and second tunnel barrier layers may comprise an insulator. By way of example, the first and second tunnel layers may comprise of at least one of $La_{0.1}Bi_{0.9}MnO_3$, $Al_2O_3$, GaO, GeO, MgO, GaAs, AlGaAs. In accordance with another example implementation, the first and second tunnel barrier layers may comprise a ferroelectric. For example, the first and second ferroelectric layers may comprise at least one of $BaTiO_3$, $Ba_{0.95}Sr_{0.05}TiO_3$, $Hf_{0.5}Zr_{0.5}O_2$, $PbTiO_3$, $YMnO_3$, $BiFeO_3$, Si doped $HfO_2$, and $SrBi_2TaO_9$.

The electronic device may further include a substrate beneath the first magnetostrictive layer. By way of example, the substrate may comprise at least one of $SrTiO_3$, Si, $SmScO_3$, and $TbScO_3$. The electronic device may also include electronic circuitry coupled to the first, second and third electrodes for operation as a memory device. More particularly, the memory device may comprise a plurality of memory cells, each operable to store eight memory states.

A related method for making an electronic device may include forming a first piezoelectric layer electrically coupled to a first electrode, forming a first magnetostrictive layer above the first piezoelectric layer, forming a first tunnel barrier layer above the first magnetostrictive layer, and forming a ferromagnetic layer above the first ferroelectric layer. The method may further include forming a second electrode electrically coupled to the ferromagnetic layer, forming a second tunnel barrier layer above the ferromagnetic layer, forming a second magnetostrictive layer above the second tunnel barrier layer, forming a second piezoelectric layer above the second magnetostrictive layer, and forming a third electrode electrically coupled to the second piezoelectric layer. The first piezoelectric layer may be strained responsive to voltage applied across the first and second electrodes, and the second piezoelectric layer being strained responsive to voltage applied across the second and third electrodes.

DETAILED DESCRIPTION

The present description is made with reference to the accompanying drawings, in which exemplary embodiments are shown. However, many different embodiments may be used, and thus the description should not be construed as limited to the particular embodiments set forth herein. Rather, these embodiments are provided so that this disclosure will be thorough and complete. Like numbers refer to like elements throughout, and prime and multiple prime notation are used to indicate similar elements in different embodiments.

Figure 1:
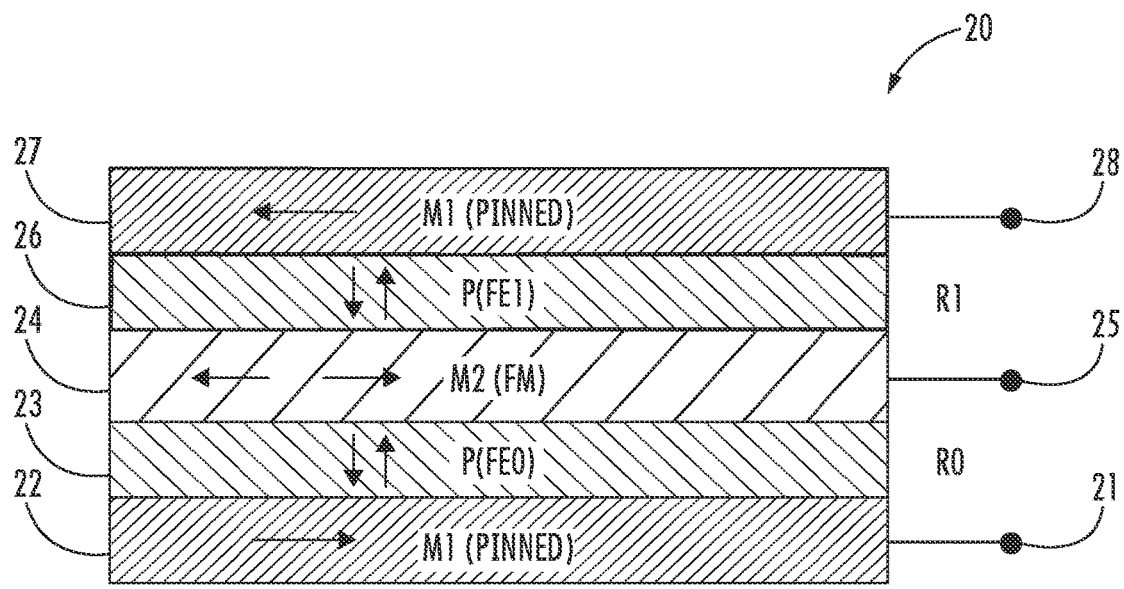
FIG. 1 is a schematic cross-sectional diagram of an eight-state, multiferroic tunnel junction memory cell in accordance with an example embodiment.

Referring initially to FIG. 1, a magnetoresistive memory cell 20 is first described. The memory cell 20 illustratively includes a first electrode 21, a first magnetostrictive (pinned) layer 22 electrically coupled to the first electrode, a first ferroelectric layer 23 above the first ferromagnetic layer, and a ferromagnetic (free) layer 24 above the first ferroelectric layer. The memory cell 20 further illustratively includes a second electrode 25 electrically coupled to the ferromagnetic layer 24, a second ferroelectric layer 26 coupled to the ferromagnetic layer, a second (pinned) magnetostrictive layer 27 above the second ferroelectric layer, and a third electrode 28 electrically coupled to the second magnetostrictive layer. The first ferroelectric layer 23 is switchable between different polarization states responsive to a first voltage applied across the first and second electrodes 21, 25, and the second ferroelectric layer 26 is switchable between different polarization states responsive to a second voltage applied across the second and third electrodes 25, 28.

The ferromagnetic layer, 24, is also switchable via voltage application. The switching of the piezoelectric layers via voltage pulse strains the adjacent fixed magnetostrictive material they are mechanically coupled to. This strain changes the magnitude of the magnetic field from the fixed magnetostrictive material due to the inverse magnetostrictive effect. The change in magnitude of magnetic field from these element results in a net magnetic field at the free ferromagnetic layer, 24, switching its magnetization direction.

Thus the logic state of the ferroelectric layers, 26 and 23, are each independently controllable by the application of voltage. Furthermore the ferromagnetic layers magnetization state contains the memory of the last switched piezoelectric. Hence there are two normal memory states and one recurrent memory state. The recurrent state can be utilized for artificial intelligence applications such as in commonly used recurrent neural networks. As this recursion is hardware implemented and occurs in the same clock cycle as the ferroelectric state switching, it can offer significant speed increases neural network learning.

Figure 2:
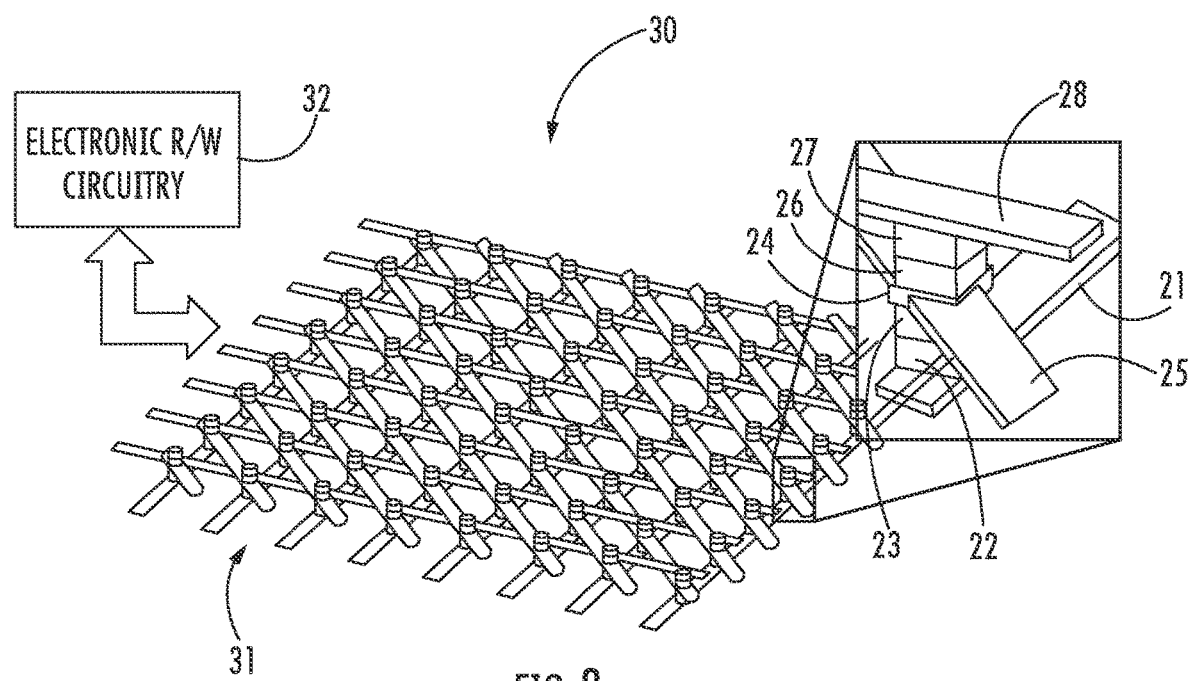
FIG. 2 is a schematic block diagram of a memory device incorporating the memory cell illustrated in FIG. 1 in an example embodiment.

The memory cell 20 defines a voltage-controlled, eight-state, pulse-quality-independent, Multiferroic Tunnel Junction (MFTJ) architecture that enables relatively low power operation with higher-density embedded storage, and in one example implementation may be used to implement a memory 30 including a 3D Recurrent Neural Network (RNN) memristor network or array 31 (FIG. 2). The memory cell 20 may accordingly improve storage densities and memory bandwidth, which is significant for artificial intelligence (AI) applications, as well as to improve hardware and algorithm efficiencies through coupling recursion operations prevalent in signal processing algorithms with a native hardware implementation. The memory cell 20 may advantageously provide reductions in power requirements comparable to those achieved with conventional voltage-controlled magnetoresistive memories. In addition, given that the switching mechanism is independent of voltage pulse characteristics, implementing these elements may be more practical than current Voltage-Controlled Magnetic Anisotropy (VCMA) approaches. This is because the signal integrity demands will not be as strict, meaning that there is a reduced likelihood for miswrites in a general memory or computing architecture.

By way of background, VCMA memories use an electric-field-induced change in orbitals at a ferromagnetic/oxide interface to control magnetization in the free layer at much lower currents. However, a limiting factor in VCMA memory is that the duration and amplitude of the applied voltage write pulse needs to be precisely controlled, which can be difficult to achieve in practice. This is especially true in very large scale integration implementations which are a necessary requirement for most memory application.

In typical MFTJs, a ferroelectric-controlled tunneling resistance and combined ferroelectric/ferromagnetic states may also be achieved, yielding four- and eight-state logic devices. However, these devices may similarly be limited by the obstacles in writing to the ferromagnetic layer, while achieving high storage densities.

In contrast to these prior approaches, the memory cell 20 advantageously achieves desired signal-quality-independent robustness of STT-MRAM, the low current draw of VCMA, and the additional logic states possible with an MFTJ. Voltage-controlled switching of the free ferromagnetic layer 24 is accomplished via the strain coupling of ferroelectric layers 23, 26 to the two oppositely poled, fixed, magnetostrictive, ferromagnetic layers 22, 27. The process of switching the ferroelectric layer 23 or 26 (which have piezoelectric properties) imparts strain on the adjacent, fixed magnetostrictive layer 22 or 27. This strain then causes a change in the magnetization of the adjacent fixed magnetostrictive layer 22, 27 due to the inverse magnetostrictive effect, which, in turn, causes a net magnetic field at the free ferromagnetic layer 24. This results in a state change of the free ferromagnetic layer 24 if materials are chosen such that this net magnetic field is sufficiently large and the magnetic anisotropy of the free layer is sufficiently small. Through a series of switches, eight logic/memory states can be achieved (see FIG. 5). Note that this switching mechanism results in the ability to store which ferroelectric state was last switched in the ferromagnetic layer 24, making it recursive in nature at the hardware level. In the example illustrated in FIG. 2, the array 31 of memory cells 20 are connected to electronic read/write circuitry 32 to control the read/write cycles, as will be appreciated by those skilled in the art.

By way of example, the first and second magnetostrictive layers 22, 27 may include one or more of Co, Fe, NiFe, MnAs, $Fe_4N$, MnAl, $Co_4N$, LSMO, $SrRuO_2$, and CoFeB. Also by way of example, the ferromagnetic layer 24 may include one or more of Co, Fe, NiFe, MnAs, $Fe_4N$, MnAl, $Co_4N$, LSMO, $SrRuO_2$, and CoFeB, and the first and second ferroelectric layers may include one or more of $BaTiO_3$, $Ba_{0.95}Sr_{0.05}TiO_3$, $PbTiO_3$, $YMnO_3$, $BiFeO_3$, Si doped $HfO_2$, and $SrBi_2TaO_9$, although other suitable materials may able be used in different embodiments.

Figure 3:
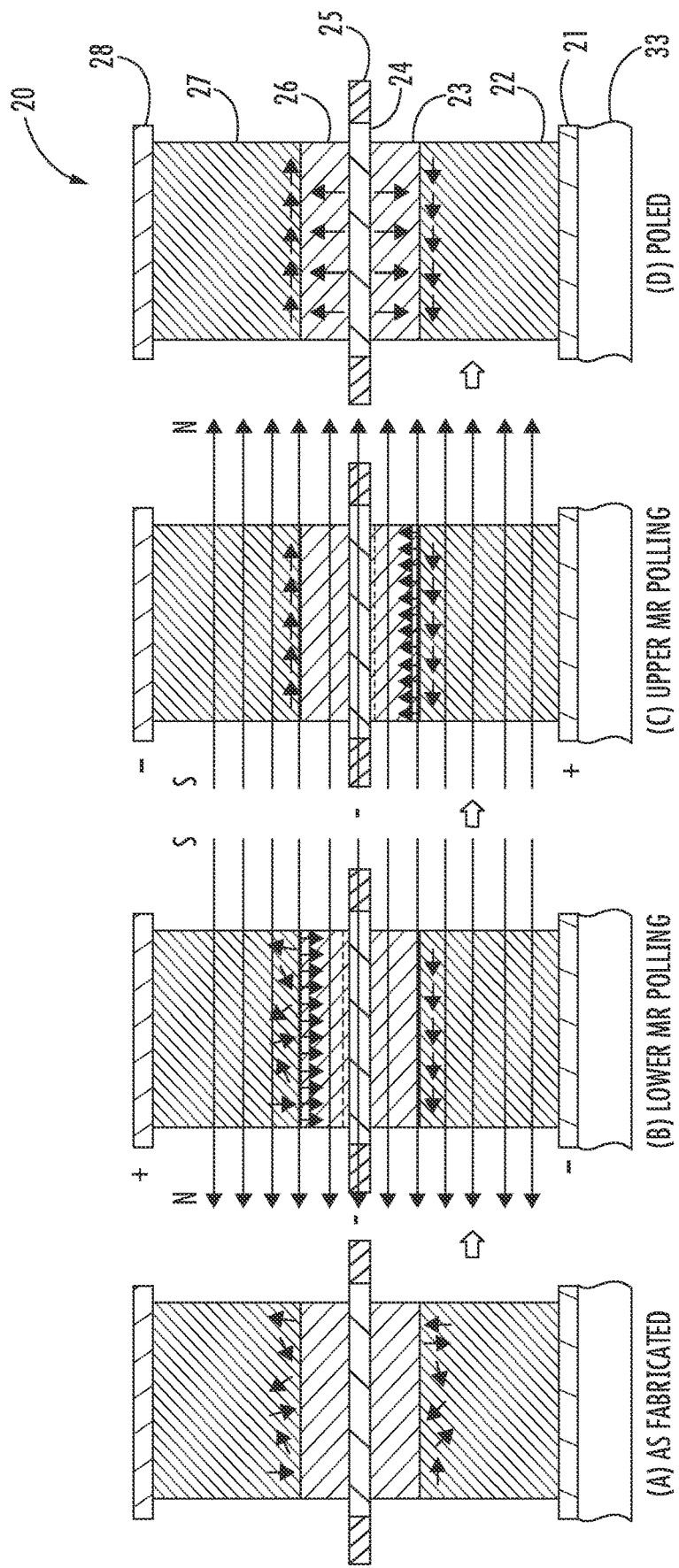
FIGS. 3(a)-3(d) are a series of schematic block diagrams illustrating magnetic polling of the memory cell of FIG. 1 in an example embodiment.

Referring additionally to FIGS. 3(a)-3(d), an example approach for fabricating and poling the memory cell 20 is shown. The memory cell 20 is formed by successively depositing the above-noted layers on a substrate 33. By way of example, the substrate 33 may include one or more of $SrTiO_3$, Si, $SmScO_3$, and $TbScO_3$. The memory cell 20 as fabricated is shown in FIG. 3(a). Then, the memory cell 20 is poled using an external magnetic field to first set and pin the magnetostrictive (MR) layers 22, 27 (FIGS. 3(b)-3(c)). The magnetostrictive layers 22, 27 are then permanently pinned in opposite directions and the memory cell 20 is then ready for operation, as seen in FIG. 3(d).

Figure 4:
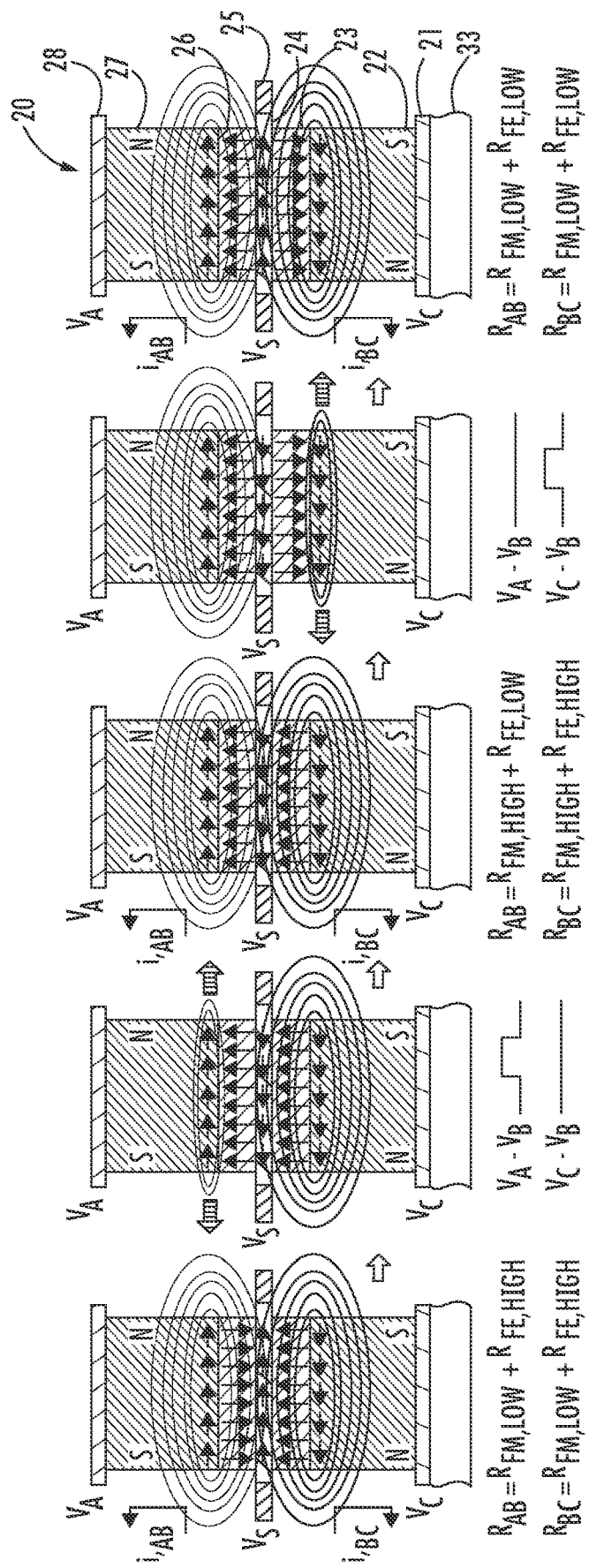
FIGS. 4(a)-4(e) are a series of schematic block diagrams illustrating reading and writing operations associated with the memory cell of FIG. 3(d).
Figure 5:
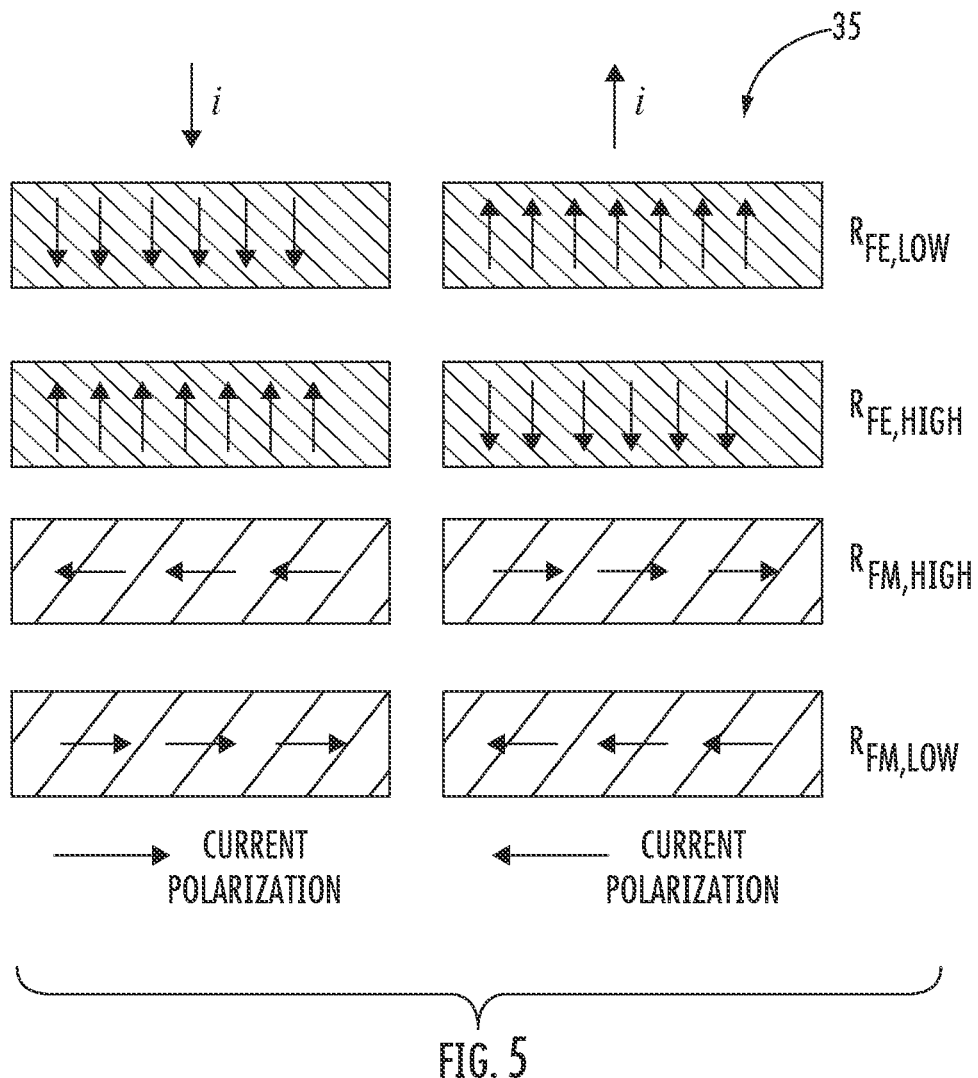
FIG. 5 is a schematic block diagram illustrating the eight states of the memory cell of FIG. 3(d).

Operation of the memory cell is now described further with reference to FIGS. 4(a)-4(e) and the chart 35 of FIG. 5. Voltage pulses are used to change the free ferromagnetic 24 and ferroelectric layer 23, 26 poling, for a total of 8 possible resistance states (FIG. 5). In the illustrated example, the electrode layer 28 corresponds to $V_A$, the electrode layer 25 corresponds to $V_B$, and the electrode layer 21 corresponds to $V_C$. The memory cell 20 begins in an initial state shown in FIG. 4(a). A resistance $R_{AB}$ (measured across electrode layers 25, 28) equals $R_{FM,Low}+R_{FE,High}$, and a resistance $R_{BC}$ (measured across electrode layers 25, 28) equals $R_{FM,Low}+R_{FE,High}$, where FM corresponds to the free ferromagnetic layer 24 and FE corresponds to the respective ferroelectric layer 23 or 26.

In FIG. 4(b), a voltage (write) pulse is applied across the electrode layers 25, 28, which changes the polarity of the ferroelectric layer 26 and free ferromagnetic layer 25, and this state change is reflected during the read cycle shown in FIG. 4(c). The read operation is performed by sensing the resistance $R_{AB}$ or $R_{AC}$ when passing a current $i_{AB}$ or $i_{BC}$. Current is limited by whether the spin polarization induced by the free layer matches the spin of electrons in the tunnel junction and fixed magnetostrictive layers 22, 27. Specifically, if there is a mismatch, then current flow is reduced. Current is also controlled by the ferroelectric layer where current is reduced when the ferroelectric is poled oppositely to the current direction.

In FIG. 4(d), another voltage (write) pulse is applied across the electrode layers 21, 25, changing the polarity of the ferroelectric layer 23 and the free ferromagnetic layer 24, as reflected during the read cycle shown in FIG. 4(e). Further write operations may be performed to switch between the eight different polarization states reflected in the table 35. Here again, resistance changes depend on the direction of current polarization set by the pinned magnetoresistive (MR) materials in combination with the current direction set by the voltages during readout. The illustrated three switchable layer configuration provides $2^3=8$ unique resistance states, thereby providing an eight-state memory cell.

Because the memory cell 20 is voltage-controlled, current draw may be relatively low and similar to VCMA approaches. By way of example, the memory cell 20 may have current draws below 10 mA, and in some embodiments below 100 µA or even below 50 µA. This voltage-based approach may also help improve switching speeds. More particularly, as a result of the lower power operation, less energy needs to be delivered to the tunnel junction before switching occurs. Additionally, in contrast to the VCMA approach, the voltage pulse does not need to be precisely controlled. If the applied pulse is sufficient to switch the piezoelectric layer, the ferromagnetic layer will also switch. As noted above, eight states can be realized in the illustrated example, with one state corresponding to the last ferroelectric state change, yielding an additional logic function that may be used to improve speed in RNNs, which may be particularly beneficial for Artificial Intelligence and Machine Learning (AI/ML) applications, for example.

One example use case for the memory cell 20 is in neuromorphic computing, which requires scaling to the desired application. Neuromorphic chip architectures may vary significantly depending on the task, making neuromorphic processing unit (NPU) application specific integrated circuit (ASIC) development appropriate for different applications. To maintain low power and high performance, cores and supporting memory may be added to scale in lieu of speed due to power penalties with increasing clock rates. NPUs may take advantage of the same heterogeneous integration (HI) approaches currently gaining traction in the semiconductor industry, also known as More-than-Moore. These HI techniques help to minimize ASIC development costs and limitations of large System-on-Chip (SOC) developments, such as the prohibitively high costs of design, yield loss, and test coverage. The scaling of cores provides unique possibilities that same-chip (memory) packaging takes advantage of such as stacking technologies. The memory 30 may advantageously leverage these capabilities for heterogeneous packages, incorporating the above-described multiferroic tunnel junction memory or memristor networks built into heterogeneous logic structures.

The memory cell 20 may accordingly provide benefits inherent in a robust, voltage-written, eight-state, multiferroic resistive memory storage, with decreased switching power and the attendant increases in storage density. Additionally, for each set of two directly writable ferroelectric elements 23 and 26, the memory of the last switched element information is stored in the state of the free ferromagnetic layer 24. This may advantageously enable hardware-implemented, component-level, recurrent memristor neural network architectures that may operate at increased speed compared to alternate recurrent network approaches. These benefits result from the use of a piezoelectric ferroelectric material to provide a ferroelectric tunnel junction element that induces a strain on a fixed magnetostrictive layer. This strain, in turn, induces the magnetic field needed to switch the free ferromagnetic layer 24 based on the inverse magnetostrictive, or Villari, effect. It will be appreciated that this electro-elastic magnetic coupling may also be implemented in other classes of logic and storage architectures beyond those specifically referenced here, as will be appreciated by those skilled in the art.

A related method for making the electronic device 20 may include forming the first magnetostrictive layer 22 electrically coupled to first electrode 21, forming the first ferroelectric layer 23 above the first ferromagnetic layer, and forming the ferromagnetic layer 24 above the first ferroelectric layer. The method may further include forming the second electrode layer 25 electrically coupled to the ferromagnetic layer 24, forming the second ferroelectric layer 26 above the ferroelectric layer, forming the second magnetostrictive layer 27 above the second ferroelectric layer, and forming the third electrode 28 electrically coupled to the second magnetostrictive layer.

Various modifications of the above-described memory cell 20 may be utilized in some embodiments. For example, ferroelectrics may have voltage tunable dielectric constants, thereby introducing variable time delays. In-memory computing and sensing may also be applied based on the coupled piezoelectric and magnetoresistive properties (magnetoelectric sensing). These may include RF sensing, acoustic sensing, vibration sensing, and magnetic field sensing, for example.

Figure 6A:
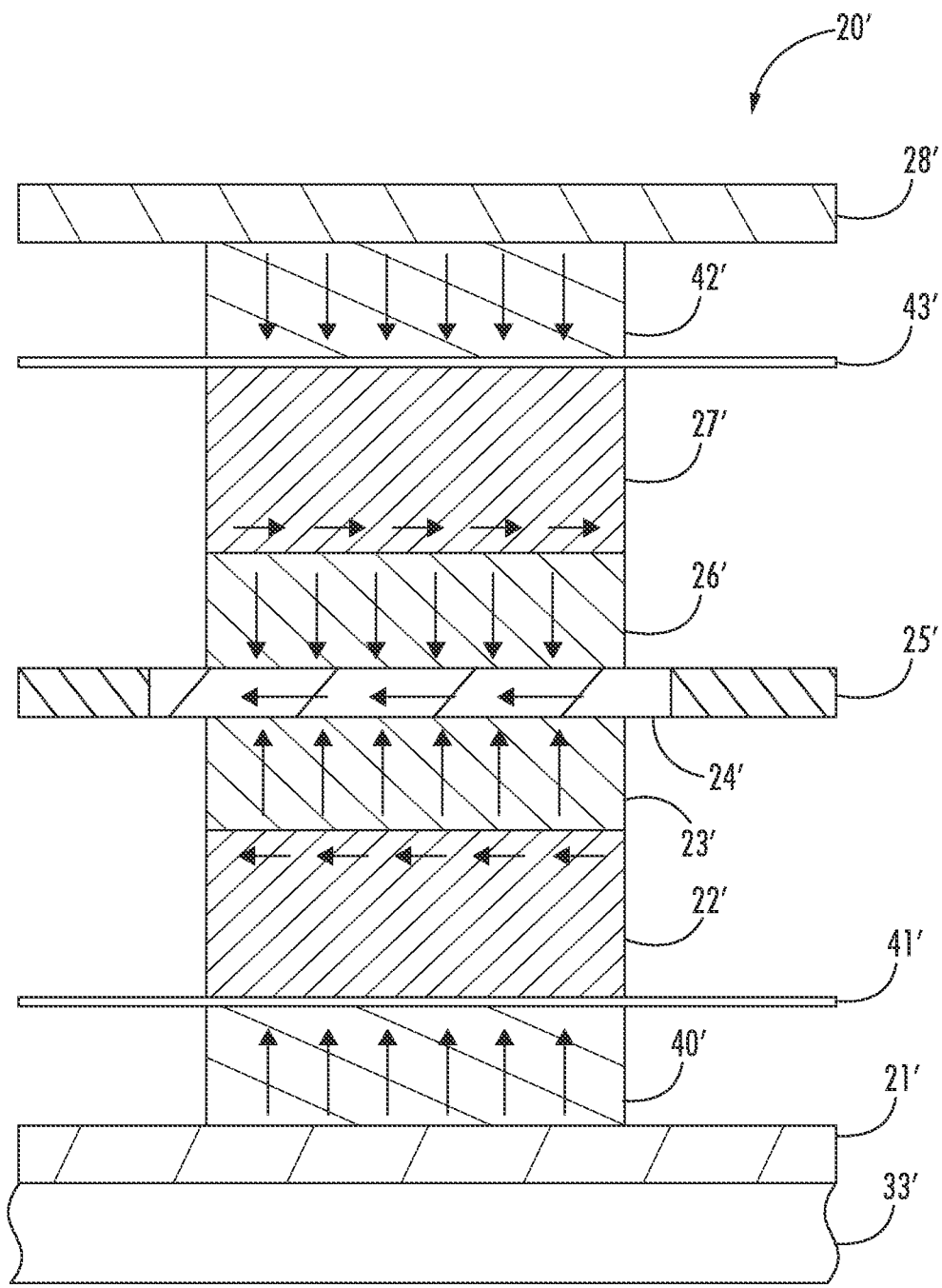
FIGS. 6A and 6B are schematic cross-sectional diagrams of alternative embodiments of the memory cell of FIG. 3(d) including piezoelectric elements to assist in ferromagnetic layer switching.
Figure 6B:
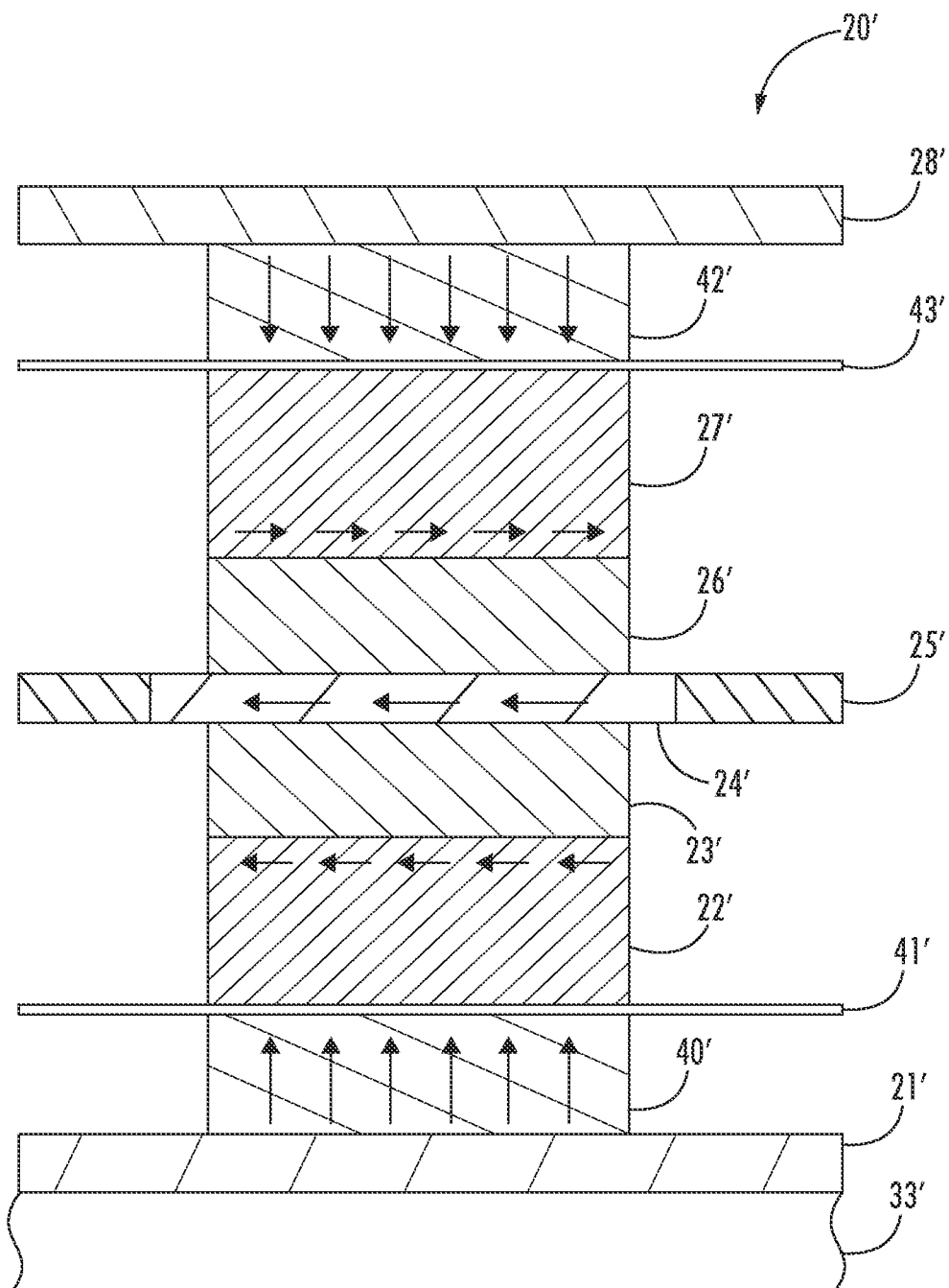

Turning now to FIGS. 6A and 6B, a magnetoresistive memory cell 20' may include a first piezoelectric layer 40' electrically coupled to a first electrode 21', a first magnetostrictive layer 22' (and optional read/write electrode 41') above the first piezoelectric layer, a first tunnel barrier layer 23' above the first magnetostrictive layer, and a ferromagnetic layer 24' above the first barrier layer. A second electrode 25' is electrically coupled to the ferromagnetic layer 24', forming a second tunnel barrier layer 26' above the ferromagnetic layer, a second magnetostrictive layer 27' is above the second tunnel barrier layer, and a second piezoelectric layer 42' (and optional read/write electrode 43') is above the second magnetostrictive layer. A third electrode 28' is electrically coupled to the second piezoelectric layer.

The ferromagnetic layer, 24', is switchable via voltage application. Applying voltage to one of the piezoelectric layers results in strain due to the piezoelectric effect which in turn strains the adjacent, mechanically coupled, fixed magnetostrictive material. This strain changes the magnitude of the magnetic field from the fixed magnetostrictive material due to the inverse magnetostrictive effect. The change in magnitude of magnetic field from said element results in a net magnetic field at the free ferromagnetic layer, 24', switching it's magnetization direction.

The tunnel barrier material may be insulating, or ferroelectric. In the example illustrated in FIG. 6A the tunnel barrier layers 23', 26' are ferroelectric, whereas in the embodiment shown in FIG. 68 they are insulating. In embodiments where the barrier layers 23' and 26' are insulators, a two state voltage switchable magnetoresistive tunnel junction is realized. While the junction is multiferroic in its switching mechanism, the resistance state is determined solely by the state of the free ferromagnetic layer. In embodiments where the barrier layers 23' and 26' are ferroelectric, each are independently controllable by the application of voltage, which when combined with the ferromagnetic state results in an e state logic device.

Furthermore, if the switching voltage of the ferroelectric tunnel layers corresponds with the application of voltage to the fixed piezoelectric layers the ferromagnetic layers magnetization state contains the memory of the last switched piezoelectric. Hence there are two normal memory states and one recurrent memory state. As noted above, the recurrent state can be utilized for artificial intelligence applications such as in commonly used recurrent neural networks. As this recursion is hardware implemented and occurs in the same clock cycle as the ferroelectric state switching, it can offer significant speed increases neural network learning.

In contrast to the typical MFTJs noted above, the memory cell 20' also advantageously achieves desired signal-quality-independent robustness of STT-MRAM, the low current draw of VCMA, and the additional logic states possible with an MFTJ. Voltage-controlled switching of the free ferromagnetic layer 24' is accomplished via the strain coupling of piezoelectric layers 40', 42' to the two oppositely poled, fixed, magnetostrictive, ferromagnetic layers 22', 27'. The process of applying voltage to layer 40' or 42' (which have piezoelectric properties) imparts strain on the adjacent, fixed magnetostrictive layer 22' or 27'. This strain then causes a change in the magnetization of the adjacent fixed magnetostrictive layer 22', 27' due to the inverse magnetostrictive effect, which, in turn, causes a net magnetic field at the free ferromagnetic layer 24'. This results in a state change of the free ferromagnetic layer 24' if materials are chosen such that this net magnetic field is sufficiently large and the magnetic anisotropy of the free layer is sufficiently small. When the barrier layers are a ferroelectric material, a series of switches (eight logic/memory states) can be achieved (see FIG. 5). Note that this switching mechanism results in the ability to store which ferroelectric state was last switched in the ferromagnetic layer 24', making it recursive in nature at the hardware level.

By way of example, the first and second magnetostrictive layers 22', 27' may include one or more of Co, Fe, NiFe, MnAs, $Fe_4N$, MnAl, $Co_4N$, LSMO, $SrRuO_2$, and CoFeB. Also by way of example, the ferromagnetic layer 24' may include one or more of Co, Fe, NiFe, MnAs, $Fe_4N$, MnAl, $Co_4N$, LSMO, $SrRuO_2$, and CoFeB, and the first and second piezoelectric and barrier layers may include one or more of $BaTiO_3$, $Ba_{0.95}Sr_{0.05}TiO_3$, $H_{0.5}Zr_{0.5}O_2$, $PbTiO_3$, $YMnO_3$, $BiFeO_3$, Si doped $HfO_2$, and $SrBi_2TaO_9$, with the barrier layers possibly being comprised of $La_{0.1}Bi_{0.9}MnO_3$, $Al_2O_3$, GaO, GeO, MgO, GaAs, AlGaAs in insulator barrier junction embodiments, although other suitable materials may able be used in different embodiments.

The structures described herein may accordingly provide computational elements to support and enhance machine learning efforts, especially in the domains of continuous signal processing. This is accomplished through their relatively low power consumption and ability to provide high-density storage and/or computing functions while maintaining a record of their previous state. This makes it possible to implement recursion natively at a hardware level. Although standard AI-enabling hardware, such as central processing, graphics processing, and tensor processing units, are and will remain valuable for aspects of ML, they are not natively recurrent. This means that any recurrent processing needs to be separate from normal functions, requiring additional energy and time. The above-described tunnel junction approach may not only help solve storage density problems on and off chip, but also provide a truly hardware element-based approach to recursion without extra processing. This may advantageously offer a distinct technological advantage for processing continuous signals common in imagery intelligence (IMINT), signal intelligence (SIGINT), and human intelligence (HUMINT) analysis.

In addition to a need for AI-specific computation step acceleration and fast read/write operations, another challenge to AI/ML implementation is storage density and power consumption. Small, fixed, low-observable installations, as well as mobile-platform systems, require low size, weight, and power (SWAP). To enable comprehensive situational awareness, AI inference processing from multiple sensors is used to provide accurate, autonomous data analysis. This results in a relatively large amount of data and processing. Given that real-time decision making is also involved, high-bandwidth on-chip memory may in some applications be necessary to make calculations faster than allowed through the von Neumann memory bottleneck, which occurs when computing elements share the same global memory. The above-described, 8 and 16-state, voltage-controlled, multiferroic tunnel junction device 20 provide low-power operation and may be integrated locally with other computational elements to meet such challenging demands. Similarly, even large data centers are concerned with power, storage density, and heat management. The low-power operation of these memory elements 20 may also provide reduced heating at increased density and low power consumption necessary for the growing rate of data acquisition. Other applications may include memristor-like networks that incorporate the above-described multiferroic tunnel junctions for their potential performance benefits, particularly for recurrent neural nets for processing continuous signals prevalent in signal intelligence and video-based computer-vision applications, for example.

A related method for making the electronic device 20' may include forming the first piezoelectric layer 40' electrically coupled to the first electrode 21', forming a first magnetostrictive layer 22" above the first piezoelectric layer (and optional read/write electrode 41'), forming a first tunnel barrier layer 23' above the first magnetostrictive layer, and forming a ferromagnetic layer 24' above the first ferroelectric layer. The method may further include forming a second electrode 25' electrically coupled to the ferromagnetic layer 24', forming a second tunnel barrier layer 26' above the ferromagnetic layer, forming a second magnetostrictive layer 27' above the second tunnel barrier layer, forming a second piezoelectric layer 42' above the second magnetostrictive layer (and optional read/write electrode 43'), and forming a third electrode 28' electrically coupled to the second piezoelectric layer. The first piezoelectric layer 40' may be strained responsive to voltage applied across the first and second electrodes 21' and 25', and the second piezoelectric layer being strained responsive to voltage applied across the second and third electrodes 25' and 28'.

Figure 7:
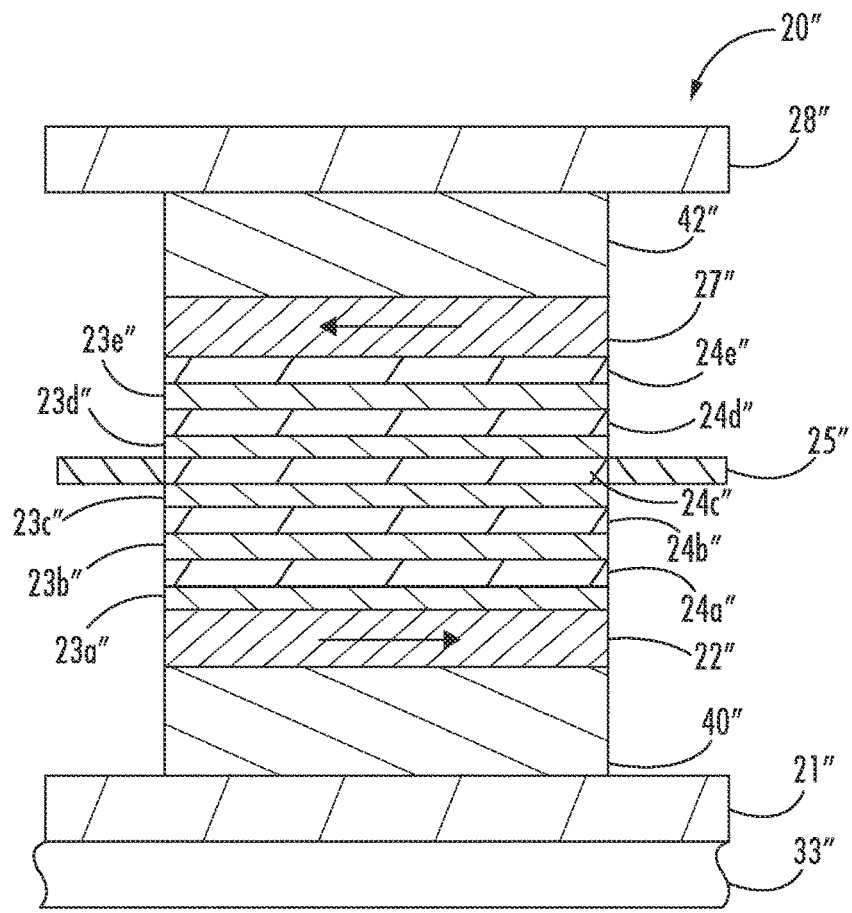
FIG. 7 is a schematic cross-sectional diagram of an alternative embodiment of the memory cell of FIG. 6A including a plurality of ferromagnetic layers providing sixteen-state operation.

Turning now to FIG. 7, in another example embodiment a multistate magnetoresistive cell 20" illustratively includes a first electrode 21" on a substrate 33", a first piezoelectric layer 40" electrically coupled to the first electrode, a first fixed ferromagnetic (magnetostrictive) layer 22" above the first ferroelectric layer. These layers are followed by an arbitrary number of free ferromagnetic layers 24a"-24e" (five in the present example) and insulating tunnel layers 23a"-23d" (five in the present example) arranged in an alternating stack. The fixed ferromagnetic layer 22" is accessible electrically via the electrode 21', for application of voltage across the piezoelectric layer 40". Similarly, above the free alternating ferromagnetic and insulating layers 24a"-24e" and 23a"-23d" the cell includes an oppositely poled fixed ferromagnetic (magnetostrictive) layer 27" electrically accessible via an electrode 28" and mechanically coupled to a piezoelectric layer 42". The electrode 28" is for the application of voltage across the piezoelectric layer 42" and the underlying ferromagnetic layer 27". A read electrode 25" is tied to one of the ferromagnetic layers (here layer 24c") throughout the free ferromagnetic/insulating tunnel layer stack.

In this configuration a voltage applied across either of the piezoelectric layers 40", 42" results in a strain in the respective magnetostrictive layer 22", 27" via the piezoelectric effect. This strain is then transferred to the mechanically coupled magnetostrictive layer 22", 27" resulting in a change in the magnetization due to the Viralli effect. The change in magnetization results in a net magnetization in the alternating free ferromagnetic and insulating tunnel barrier layers 24a"-24e" and 23a"-23d", If a given ferromagnetic layer 24a"-24e" experiences a sufficient magnetic field, above the magnetic anisotropy or coercivity, its magnetization state will change, altering the resistance of the junction. This sufficient magnetic field is not only a function of the magnetic coercivity which may be tuned layer by layer, but also the distance of the layer from the fixed magnetostrictive layer 22" or 27", applied voltage, piezoelectric coefficient of the piezoelectric layer 40" or 42", and inverse magnetostrictive coefficient of the fixed ferromagnetic layer 24a"-24e".

Figure 8:
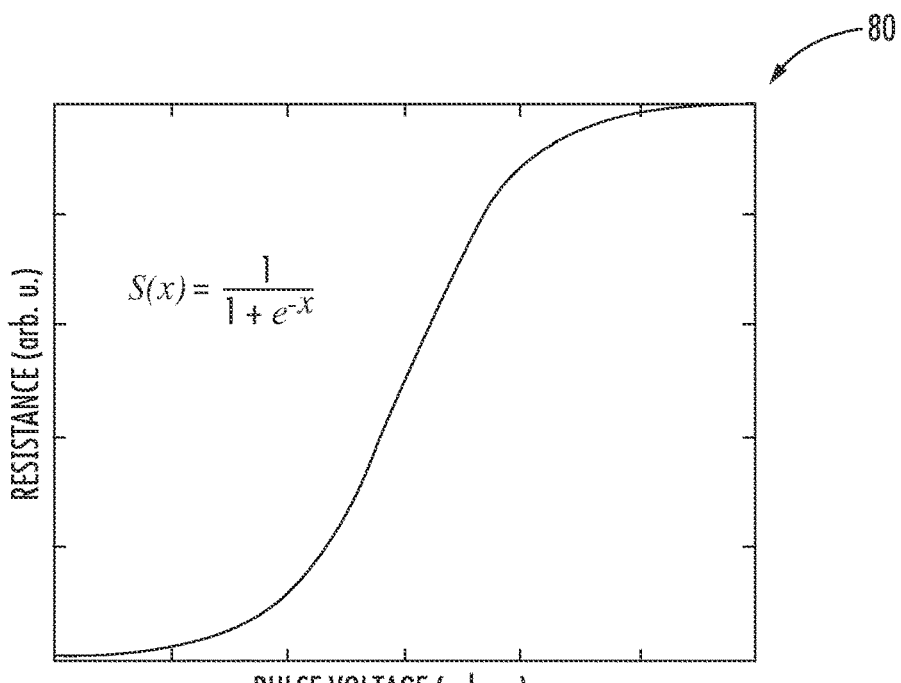
FIG. 8 is a graph of resistance vs. pulse voltage for the memory cell of FIG. 7.

Depending upon the relative thickness of the fixed magnetostrictive ferromagnetic layer 22" or 27" and the alternating free ferromagnetic and insulating tunnel barrier layers 24a"-24e" and 23a"-23d", the shape of the pulse voltage vs. resultant resistance curve may vary. Considering a relatively thick fixed layer in comparison to the free layers as in an example embodiment, the resultant resistance as a function of pulse width will be a pseudo sigmoid function as shown in FIG. 8. When the voltage pulse results in large number or all of the free ferromagnetic layers 24a"-24e" to be aligned with the fixed ferromagnetic layer 22" or 27", the resistance of the stack will be low as the spin filtered electrons from the fixed magnetic layer experience only layers with the same magnetization. If in contrast the layers are oppositely opposed to the fixed layer, the resistance will be relatively high.

The voltage controlled MFTJ elements enable relatively low power operation with higher-density embedded storage in comparison to current switched systems. In contrast to VCMA based switching, the logic state of these components is not pulse quality dependent. Additionally, while this pulse quality dependence poses significant challenges to traditional magnetic tunnel junctions, the present multi-state logic component is not subject to the limitations of a VCMA mechanism.

By way of background, VCMA memories use an electric-field-induced change in orbitals at a ferromagnetic/oxide interface to control magnetization in the free layer at much lower currents. However, a restrictive factor in VCMA memory is that the duration and amplitude of the applied voltage write pulse needs to be precisely controlled, which can be difficult to achieve in practice. In typical MFTJs, a ferroelectric-controlled tunneling resistance and combined ferroelectric/ferromagnetic states may also be achieved, yielding four- and eight-state logic devices. However, these devices may similarly be limited by the obstacles in writing to the ferromagnetic layer, while achieving high storage densities.

In some embodiments, the MFTJ 20" may include an alternating stack of ferromagnetic (as opposed to insulating) layers 23a"-23e" and free ferroelectric layers 24a"-24e". Voltage pulses between the upper/lower electrodes 21", 28" and the magnetostrictive layers 22", 27" cause a momentary lateral expansion/contraction of the piezoelectric layers 40", 42". This induces strain on the magnetostrictive layers 22', 27", creating a magnetic field via the inverse magnetostrictive effect (Villari effect). This magnetic field decays into the stack and flips ferromagnetic layer 23a"-23e" polarizations, and in this regard these layers may be made of varying coercivity ferromagnetic materials. This results in a tunneling resistance which varies as a sigmoid function, as seen in FIG. 9. The amplitude of the pulse also determines the depth of magnetic field penetration and nature of the gradient, which thereby allows for selective switching of one or more of the free ferroelectric layers 24a"-24c" or 24e"-24c", to thereby provide sixteen different resistive states to allow for enhanced memory density, memory states, and programmable architectures. In one example application, the memory cell 20" may advantageously be employed to replace tensor processing units at higher densities, condensing an 8-bit to 16-bit TPU cluster with a single element.

The alternating insulating tunnel barriers and free ferromagnetic layers 23a"-23e" and free ferroelectric layers 24a"-24e" between two fixed ferromagnetic layers 22", 27" offer the multi-state operation of the tunnel junction in the device 20". Although in one embodiment low powered voltage switching is obtained with a strain mediated coupling of a piezoelectric and a magnetostrictive ferroelectric resulting in a change in magnetic field at the intermediate layers, switching may also be obtained via other mechanisms. In other embodiments the ferromagnetic may be not magnetostrictive, or less magnetostrictive, and the free ferromagnetic layers may be switched through spin polarized current. Moreover, switching may be a result of an external magnetic field.

A related method for making the electronic device 20" may include forming the first magnetostrictive layer 22' above and/or electrically coupled to the first electrode 21" (and optionally above the first piezoelectric layer 40"), forming a plurality of alternating ferromagnetic and insulating (piezoelectric) layers 24a"-24e" and 23a"-23e" stacked above the first magnetostrictive layer, forming a second electrode 25" electrically coupled to an intermediate ferromagnetic layer 24c" in the stack of ferromagnetic and insulating layers, forming a second magnetostrictive layer 27" (and optional second piezoelectric layer 42") above the stack of ferromagnetic and insulating layers, and forming a third electrode 28" above and/or electrically coupled to the second magnetostrictive layer.

Various modifications of the above-described memory cells 20" may be utilized in some embodiments. For example, ferroelectrics may have voltage tunable dielectric constants, thereby introducing variable time delays. In-memory computing and sensing may also be applied based on the coupled piezoelectric and magnetoresistive properties (magnetoelectric sensing). These may include RF sensing, acoustic sensing, vibration sensing, and magnetic field sensing, for example.

The structures described herein may accordingly provide computational elements to support and enhance machine learning efforts. For many machine learning applications tensor processing units are utilized. These units offer a high volume of computation at precision as low as 8-bit. The tunnel junction stacks here are capable of performing this level of computational precision in a single element. Moreover the resultant resistance vs. voltage applied to the piezoelectric during switching offers nonlinearity very similar to a sigmoid function, a common activation function for machine learning applications. This combined 8+ bit precision with AI specific activation could offer significant computational speed when used in larger ASIC circuits in separate from, or in combination with, existing TPU architectures.

Moreover the magnetization of the free layers is maintained during the read step, thus in addition to having an 8+ bit AI specific activation this structure also acts as a memory element integrated into the computation flow. This will increase memory density by combining memory and computation and could be used to move passed the von Neumann bottleneck depending on the larger circuit architecture. The resistance based read step additionally decreases power consumption and associated heat allowing for greater densities and making chips more practical for edge computing where available energy may be limited. As noted above, incorporation of this multiferroic tunnel junction stack and AI-focused computational and memory element into larger architectures may offer distinct technological advantage for common imagery intelligence (IMINT), signal intelligence (SIGINT), and human intelligence (HUMINT) applications.

Further details of the embodiments set forth herein may be found in co-pending applications entitled "MULTI-LEVEL MULTIFERROIC MEMORY DEVICE AND RELATED METHODS", U.S. Pat. No. 12,207,565, issued Jan. 21, 2025, and "MULTIFERROIC TUNNEL JUNCTION MEMORY DEVICE AND RELATED METHODS", U.S. Publication No. 2023/0240152, published Jul. 27, 2023, both of which are hereby incorporated herein in their entireties by reference.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

The invention claimed is:

1. An electronic device comprising:
a first electrode;
a first piezoelectric layer electrically coupled to the first electrode;
a first magnetostrictive layer above the first piezoelectric layer;
a first tunnel barrier layer above the first magnetostrictive layer;
a ferromagnetic layer above the first tunnel barrier layer;
a second electrode electrically coupled to the ferromagnetic layer;
a second tunnel barrier layer above the ferromagnetic layer;
a second magnetostrictive layer above the second tunnel barrier layer;
a second piezoelectric layer above the second magnetostrictive layer; and
a third electrode electrically coupled to the second piezoelectric layer;
the first piezoelectric layer being strained responsive to voltage applied across the first and second electrodes, and the second piezoelectric layer being strained responsive to voltage applied across the second and third electrodes, to change a ferroelectric state of the ferromagnetic layer while retaining a prior ferroelectric state of the ferromagnetic layer.

2. The electronic device of claim 1 further comprising:
a first read/write electrode coupled to the first magnetostrictive layer; and
a second read/write electrode coupled to the second magnetostrictive layer.

3. The electronic device of claim 1 wherein the first and second magnetostrictive layers comprise at least one of Co, Fe, NiFe, MnAs, $Fe_4N$, MnAl, $Co_4N$, LSMO, and $SrRuO_2$.

4. The electronic device of claim 1 wherein the ferromagnetic layer comprises at least one of Co, Fe, NiFe, MnAs, $Fe_4N$, MnAl, $Co_4N$, LSMO, and $SrRuO_2$.

5. The electronic device of claim 1 wherein the first and second piezoelectric layers comprise at least one of $BaTiO_3$, $Ba_{0.95}Sr_{0.05}TiO_3$, $Hf_{0.5}Zr_{0.5}O_2$, $PbTiO_3$, $YMnO_3$, $BiFeO_3$, Si doped $HfO_2$, $SrBi_2TaO_9$, and $PbZr_xTi_{1-x}O_3$.

6. The electronic device of claim 1 wherein the first and second tunnel barrier layers comprise an insulator.

7. The electronic device of claim 1 wherein the first and second tunnel layers comprise at least one of $La_{0.1}Bi_{0.9}MnO_3$, $Al_2O_3$, GaO, Geo, MgO, GaAs, AlGaAs.

8. The electronic device of claim 1 wherein the first and second tunnel barrier layers comprise a ferroelectric layer.

9. The electronic device of claim 8 wherein the first and second ferroelectric layers comprise at least one of $BaTiO_3$, $Ba_{0.95}Sr_{0.05}TiO_3$, $Hf_{0.5}Zr_{0.5}O_2$, $PbTiO_3$, $YMnO_3$, $BiFeO_3$, Si doped $HfO_2$, and $SrBi_2TaO_9$.

10. The electronic device of claim 1 further comprising a substrate beneath the first electrode.

11. The electronic device of claim 10 wherein the substrate comprises at least one of $SrTiO_3$, Si, $SmScO_3$, and $TbScO_3$.

12. The electronic device of claim 1 comprising electronic circuitry coupled to the first, second and third electrodes for operation as a memory device.

13. The electronic device of claim 12 wherein the memory device comprises a plurality of memory cells, each operable to store eight memory states.

14. A memory comprising:
a substrate; and
a plurality of memory cells above the substrate, each memory cell operable to store eight memory states and comprising:
a first electrode;
a first piezoelectric layer electrically coupled to the first electrode;
a first magnetostrictive layer above the first piezoelectric layer;
a first tunnel barrier layer above the first magnetostrictive layer;
a ferromagnetic layer above the first tunnel barrier layer;
a second electrode electrically coupled to the ferromagnetic layer;
a second tunnel barrier layer above the ferromagnetic layer;
a second magnetostrictive layer above the second tunnel barrier layer;
a second piezoelectric layer above the second magnetostrictive layer; and
a third electrode electrically coupled to the second piezoelectric layer;
the first piezoelectric layer being strained responsive to voltage applied across the first and second electrodes, and the second piezoelectric layer being strained responsive to voltage applied across the second and third electrodes, to change a ferroelectric state of the ferromagnetic layer while retaining a prior ferroelectric state of the ferromagnetic layer.

15. The memory of claim 14 wherein each memory cell further comprises:
a first read/write electrode coupled to the first magnetostrictive layer; and
a second read/write electrode coupled to the second magnetostrictive layer.

16. The memory of claim 14 wherein the first and second magnetostrictive layers comprise at least one of Co, Fe, NiFe, MnAs, $Fe_4N$, MnAl, $Co_4N$, LSMO, and $SrRuO_2$.

17. The memory of claim 14 wherein the ferromagnetic layer comprises at least one of Co, Fe, NiFe, MnAs, $Fe_4N$, MnAl, $Co_4N$, LSMO, and $SrRuO_2$.

18. The memory of claim 14 wherein the first and second piezoelectric layers comprise at least one of $BaTiO_3$, $Ba_{0.95}Sr_{0.05}TiO_3$, $Hf_{0.5}Zr_{0.5}O_2$, $PbTiO_3$, $YMnO_3$, $BiFeO_3$, Si doped $HfO_2$, $SrBi_2TaO_9$, and $PbZr_xTi_{1-x}O_3$.

19. A method for making an electronic device comprising:
forming a first piezoelectric layer electrically coupled to a first electrode;
forming a first magnetostrictive layer above the first piezoelectric layer;
forming a first tunnel barrier layer above the first magnetostrictive layer;
forming a ferromagnetic layer above the first tunnel barrier layer;
forming a second electrode electrically coupled to the ferromagnetic layer;
forming a second tunnel barrier layer above the ferromagnetic layer;
forming a second magnetostrictive layer above the second tunnel barrier layer;
forming a second piezoelectric layer above the second magnetostrictive layer; and
forming a third electrode electrically coupled to the second piezoelectric layer;
the first piezoelectric layer being strained responsive to voltage applied across the first and second electrodes, and the second piezoelectric layer being strained responsive to voltage applied across the second and third electrodes, to change a ferroelectric state of the ferromagnetic layer while retaining a prior ferroelectric state of the ferromagnetic layer.

20. The method of claim 19 further comprising:
forming a first read/write electrode coupled to the first magnetostrictive layer; and
forming a second read/write electrode coupled to the second magnetostrictive layer.

21. The method of claim 19 wherein the first and second magnetostrictive layers comprise at least one of Co, Fe, NiFe, MnAs, $Fe_4N$, MnAl, $Co_4N$, LSMO, and $SrRuO_2$.

22. The method of claim 19 wherein the ferromagnetic layer comprises at least one of Co, Fe, NiFe, MnAs, $Fe_4N$, MnAl, $Co_4N$, LSMO, and $SrRuO_2$.

23. The method of claim 19 wherein the first and second piezoelectric layers comprise at least one of $BaTiO_3$, $Ba_{0.95}Sr_{0.05}TiO_3$, $Hf_{0.5}Zr_{0.5}O_2$, $PbTiO_3$, $YMnO_3$, $BiFeO_3$, Si doped $HfO_2$, $SrBi_2TaO_9$, and $PbZr_xTi_{1-x}O_3$.

* * * * *